(12) United States Patent  
Yamamoto (10) Patent No.: US 6,998,000 B2  
(45) Date of Patent: Feb. 14, 2006

(54) METHOD OF ADHESION AND ADHESION APPARATUS

(75) Inventor: Satoshi Yamamoto, Kanuma (JP)

(73) Assignees: Sony Corporation, Tokyo (JP); Sony Chemicals, Tokyo (JP)

( * ) Notice: Subject to any disclaimer, the term of this patent is extended or adjusted under 35 U.S.C. 154(b) by 282 days.

(21) Appl. No.: 10/372,363

(22) Filed: Feb. 21, 2003

(65) Prior Publication Data

US 2004/0216839 A1    Nov. 4, 2004

(30) Foreign Application Priority Data

Feb. 22, 2002    (JP)    ............................. 2002-045745

(51) Int. Cl.
*C09J 5/06*    (2006.01)
*B32B 31/16*    (2006.01)

(52) U.S. Cl. .................... 156/74; 156/285; 427/561; 427/208.2

(58) Field of Classification Search .................. 156/74, 156/285, 320, 322, 578; 438/118, 119; 29/832; 427/207.1, 208.2, 372.2, 561

See application file for complete search history.

(56) References Cited

U.S. PATENT DOCUMENTS

| | | | | |
|---|---|---|---|---|
| 4,778,845 A | * | 10/1988 | Tschan et al. | ............... 524/710 |
| 5,926,694 A | * | 7/1999 | Chigawa et al. | ............ 438/106 |
| 6,077,382 A | * | 6/2000 | Watanabe | .................... 156/322 |
| 6,235,554 B1 | * | 5/2001 | Akram et al. | ............... 438/109 |

* cited by examiner

*Primary Examiner*—John T. Haran  
(74) *Attorney, Agent, or Firm*—Osha Liang LLP (57) ABSTRACT

A method of adhesion inhibiting generation of bubbles is provided. Heating, evacuation and centrifugal degassing are performed on an adhesive 37 disposed in an adhesive container 30 to semi-harden the adhesive 37, then a semi-hardened adhesive is discharged as disposed in the adhesive container 30 to mount a chip. Removal of bubbles is efficiently performed since semi-hardening and degassing are simultaneously performed. Further, no defective product is produced even if a working process is stopped since no process for semi-hardening a discharged adhesive exists.

8 Claims, 6 Drawing Sheets

Fig.6c

METHOD OF ADHESION AND ADHESION APPARATUS

BACKGROUND OF INVENTION

1. Field of the Invention

The present invention relates to a technology for mounting a chip on a resin film, more particularly to a technology for fixing a chip to a resin film by discharging a certain amount of adhesive.

2. Background Art

In recent years, a technology that involves a bare chip made of a semiconductor mounted on a wiring board has been developed, and the technology has been frequently used to manufacture miniature electronic devices such as mobile phones since a packaging area can be made smaller than that of a case where a chip molded into a resin is mounted.

FIGS. 7 (a) to (e) describe a conventional process for mounting a bare chip. First, referring to FIG. 7 (a), numeral 113 shows a base film composed of a flexible resin and a wiring film 122 composed of a patterned copper foil formed on the surface of the base film 113.

To the surface of the base film 113 on which the wiring film 122 is formed, an anisotropic conductive film 115 is affixed as shown in FIG. 7 (b). The base film 113 is placed on a preheating table 151 while orienting the back side thereof downward as shown in FIG. 7 (c).

Figure 7A:
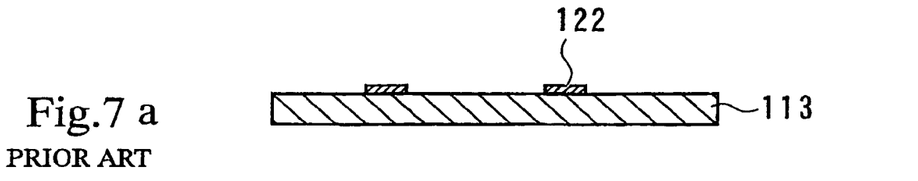
Figure 7B:
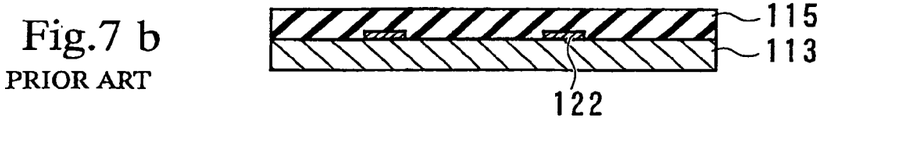

The anisotropic conductive film 115 is composed of a thermosetting resin as a main agent and conductive particles are dispersed in the main agent.

Figure 7C:
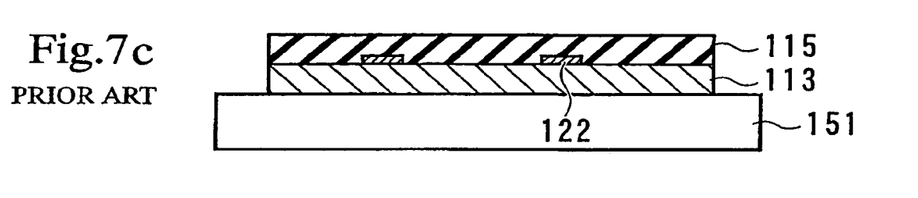

The preheating table 151 is preheated at a temperature higher than the curing temperature of the main agent contained in the anisotropic conductive film 115. Thus, the anisotropic conductive film 115 is heated by heat transmitted through the base film 113.

The main agent of the anisotropic conductive film 115 is semi-hardened by placing both the base film 113 and the anisotropic conductive film 115 on the surface of the base film 113 on the preheating table 151 for a predetermined time.

Next, as shown in FIG. 7 (d), the base film 113 and the semi-hardened anisotropic conductive film 115 are moved from the preheating table 151 to a working table 152; a semiconductor chip 111 is retained by a pressing jig 129; the semiconductor chip 111 is moved to a position above the anisotropic conductive film 115; a bump 121 of the semiconductor chip 111 and a connecting part of a wiring film 122 are so positioned as to face each other; and then, as shown in FIG. 7 (e) when the semiconductor chip 111 is pressed against the anisotropic conductive film 115 by the pressing jig 129, the bump 121 digs into the anisotropic conductive film 115; thereby the bump 121 is connected electrically to the wiring film 122 through conductive particles dispersed in the anisotropic conductive film 115.

Figure 7D:
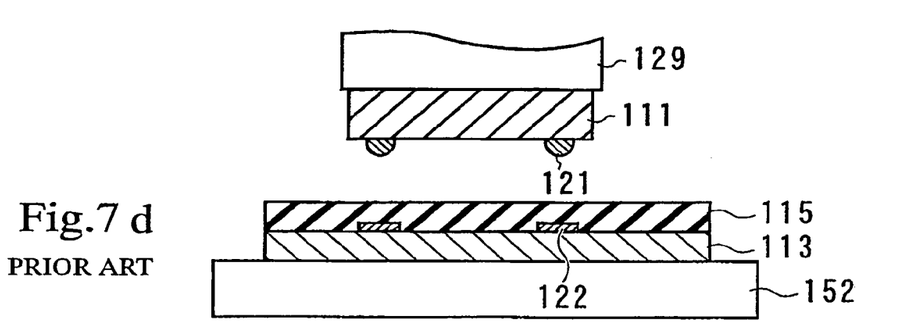
Figure 7E:
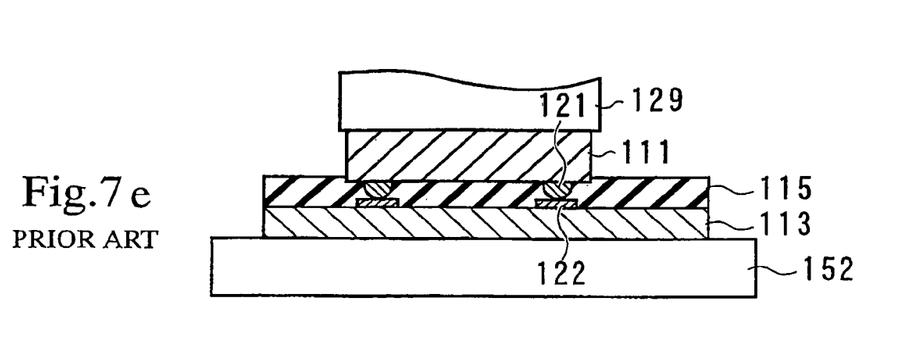

Since the pressing jig 129 and the working table 152 are heated at a temperature higher than that of the preheating table 151, by keeping the jig 129 to be pressed against the back side of the semiconductor chip 111 for a predetermined time, the main agent in the anisotropic conductive film 115 hardens and, thus, the semiconductor chip 111 is fixed to the base film 113.

In the case where the anisotropic conductive film 115 is hardened as above, the anisotropic conductive film 115 is first heated on the preheating table 151, the film is moved to the surface of the working table 152 after the film is semi-hardened, and then mounting and heating of the semiconductor chip 111 is performed; thereby heating time on the working table can be shortened by the extent corresponding to the previous semi-hardening.

However, if the semiconductor chip 111 is mounted on the anisotropic conductive film 115 on the working table 152 and the progress of the process is suspended, under the process of preheating before the mounting since the anisotropic conductive film 115 is also kept on the preheating table 151 for a long time, both of the anisotropic conductive films 115 become defective.

An alternative processing technique involves using a liquid adhesive material applied onto the base film 113 in place of the anisotropic conductive film 115. However, this processing has the problems that the material is likely to immix bubbles as compared with the anisotropic conductive film 115. As a result, a defect in aging caused by voids frequently occurs.

SUMMARY OF INVENTION

In one aspect, the present invention provides a method for adhesion wherein bubbles are not immixed and a defect does not frequently occur.

In one embodiment, the present invention relates to a method for adhesion comprising semi-hardening an adhesive capable of being hardened by proceeding with a reaction through heating; discharging a desired amount of the semi-hardened adhesive from a pore to dispose on an object to be discharged; and mounting an object to be affixed to the object to be discharged by contacting the object to be affixed to the adhesive disposed on the object to be discharged, pressing the object to be affixed against the object to be discharged, and then heating the adhesive existing between the object to be discharged and the object to be affixed to harden the adhesive.

Thus, in one embodiment, the present invention comprises a method for adhesion, wherein the object to be affixed is heated in the mounting step.

In one embodiment, the present invention comprises a method for adhesion, wherein, before performing the semi-hardening, the adhesive is disposed in an adhesive container, and the semi-hardening step and the discharging step are performed while placing the adhesive in the same adhesive container.

In one embodiment, the present invention comprises a method for adhesion, wherein the adhesive container is heated to semi-harden the adhesive in the semi-hardening step.

In one embodiment, the present invention comprises a method for adhesion, wherein the adhesive container is heated in the semi-hardening step while applying a centrifugal force to the adhesive container.

In one embodiment, the present invention comprises a method for adhesion, wherein the adhesive is heated in the semi-hardening step while placing the adhesive container in a vacuum atmosphere to vacuum-degas the adhesive.

In one embodiment, the present invention comprises a method for adhesion, wherein the adhesive is hardened at a reaction rate ranging from 2% or more to 20% or less in the semi-hardening step.

In one embodiment, the present invention comprises a method for adhesion, wherein a flexible resin film is used as the object to be discharged and a semiconductor chip is used as the object to be affixed.

In one embodiment, the present invention comprises a method for adhesion, wherein a connecting part composed of a wiring film on the resin film and a connecting part provided on the chip are brought into contact with each other, and the chip is fixed to the resin film in a state of electrical connection thereof.

In another aspect, the present invention relates to an adhesion apparatus that comprises an adhesive container connected to a pore and an adhesive disposed in the adhesive container and that is constituted so as to discharge a desired amount of the adhesive through the pore, wherein the adhesive is disposed in the adhesive container, and a centrifugal force has been applied to the adhesive in a state of being placed in vacuum atmosphere with heating to be vacuum-degassed.

In one embodiment, the present invention comprises an adhesion apparatus, wherein the adhesive is semi-hardened at a reaction rate ranging from 2% or more to 20% or less.

In one embodiment, the present invention uses an adhesive whose reaction proceeds by heating. The adhesive may contain either a thermosetting resin as a main component or a mixed resin of a thermosetting resin and a thermoplastic resin as a main component. Generally, it contains an additive such as a coupling agent or a curing agent, or a filler.

In embodiments of the invention, an adhesive is semi-hardened in an adhesive container and placed in the adhesive container as it stands can be used for a discharging process. In this case, it is no need to move the adhesive to another container, thereby saving labor.

When the adhesive is heated to progress semi-hardening, bubbles are generated in the adhesive. In embodiments of the invention, however, a centrifugal force is applied to the adhesive. Accordingly, bubbles in the adhesive quickly move to the surface of the adhesive and disappear.

Further, since the adhesive may be placed in a vacuum atmosphere during semi-hardening, bubbles are likely to be generated by an extent that the atmospheric pressure is not existent. When the adhesive is returned under the atmospheric pressure after bubbles have been removed in the state, no bubbles are generated under the atmospheric pressure. In addition, the adhesive is heated during semi-hardening and is degassed in the state.

An object for adhesion, having been semi-hardened and being placed in the discharging process, is kept at a lower temperature than that in the semi-hardening process. In addition, since the temperature of the adhesive discharged on the object to be discharged is lower than that of the semi-hardening process, bubbles are never generated in the adhesive that have been degassed in the semi-hardening process.

BRIEF DESCRIPTION OF DRAWINGS

FIGS. 1 (a) to (c) show an adhesive container, a plug thereof, and a mouthpiece member thereof, respectively;

FIG. 2 (a) shows a plugged adhesive container, and FIG. 2 (b) is a view to explain the adhesive inside the container;

FIG. 3 (a) shows an adhesive container with the mouthpiece member mounted, and FIG. 3 (b) is a view to explain the adhesive inside the container, FIGS. 4 (a), (b) are views to explain the processes of heating, evacuation and centrifugal degassing;

FIGS. 5 (a), (b) are views to explain the discharging process of a semi-hardened adhesive;

FIGS. 6 (a) to (c) are views to explain the process for mounting chips; and

FIGS. 7 (a) to (e) are views to explain a method for adhesion in a conventional technology.

DETAILED DESCRIPTION

First, the degassing process by a method according to one embodiment of the invention is described hereunder.

Figure 1A:
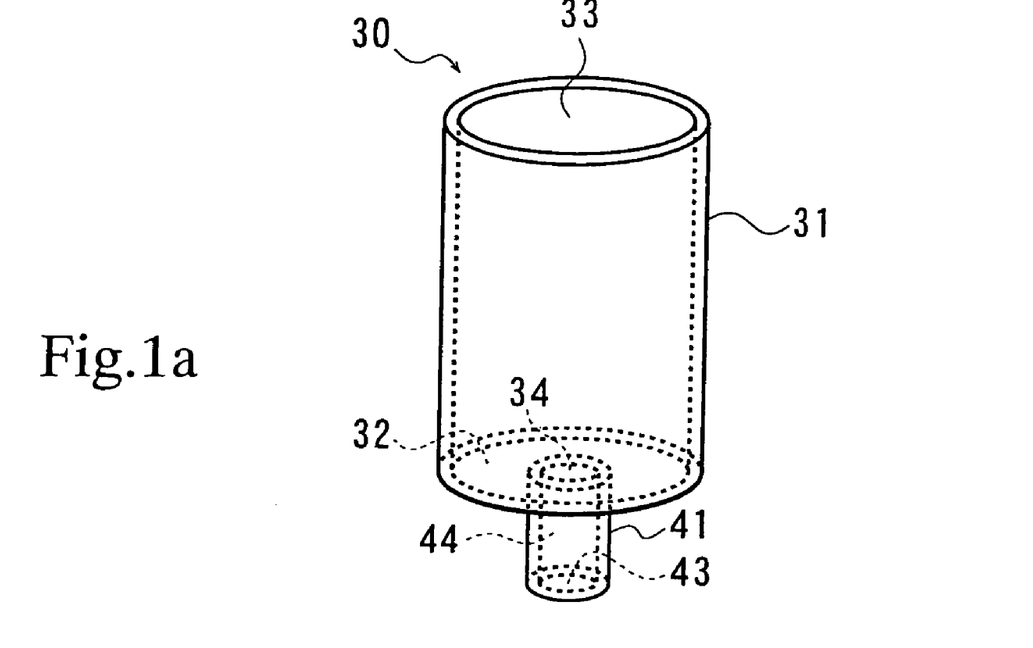

Numeral 30 in FIG. 1 (a) shows an adhesive container.

The adhesive container 30 has a cylindrical container body 31 with a bottom and a pipe-like protrusion 41. A hole 34 is formed at a bottom part 32 of the container body 31 and an end of the protrusion 41 is vertically connected to the outer side of the bottom part 32 in the state that an inside 44 of the protrusion 41 is communicated with the hole 34.

Since the protrusion 41 is cylindrical, an aperture 43, which is located at the other end of the protrusion 41, is oriented opposite to the aperture 33 of the container body 31.

Figure 1B:
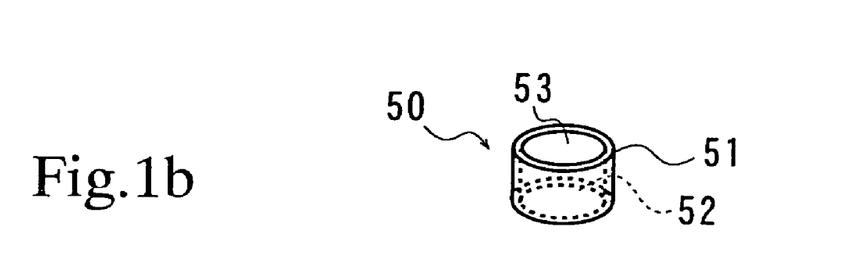

Numeral 50 in FIG. 1 (b) is a plug comprising a cylindrical plug body 51 with a bottom.

Preferably, screw threads are provided on the inner periphery of the plug body 51 and the outer periphery of the protrusion 41, and it is such constituted that when the plug body 51 is screwed into the protrusion 41 while orienting the aperture 53 of the plug body 51 toward the aperture 43 of the protrusion 41, the plug 50 is mounted on the adhesive container 30.

Figure 2A:
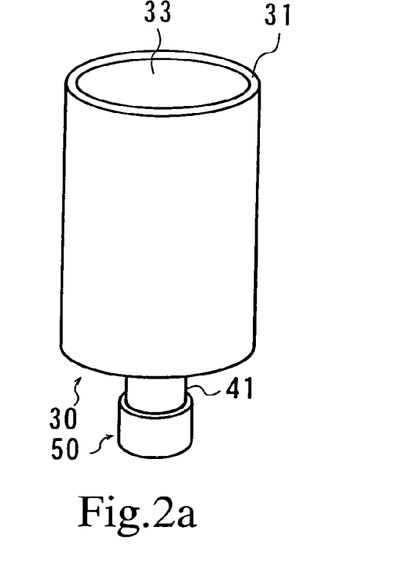
Figure 2B:
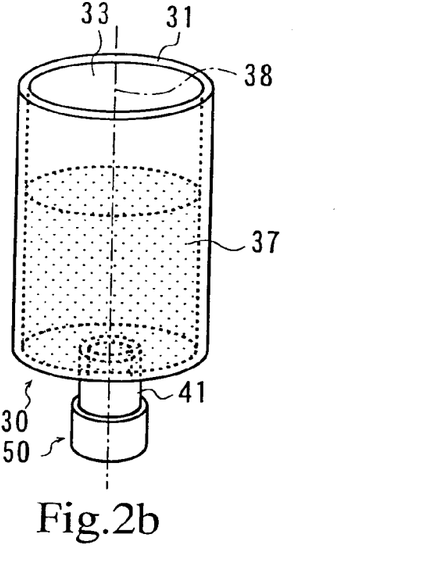

In the state that the plug 50 is mounted, as shown in FIG. 2 (b), the bottom part 52 of the plug body 51 in FIG. 1 (b) plugs the aperture 43 in FIG. 1 (a) of the protrusion 41.

In this state, when a liquid adhesive material is poured from the aperture 33 of the adhesive container 30 while orienting the aperture 33 upward and orienting the plug 50 perpendicularly downward, the adhesive material is stored in the lower part of the container body 31. Numeral 37 in FIG. 2 (b) shows an adhesive material in the container body 41 and in the state, the adhesive material 37 is also filled in the protrusion 41. The protrusion 41 and the container body 31 are fluid-tightly connected, and since the aperture 43 in FIG. 1 (a) of the protrusion 41 is plugged by the plug 50, the adhesive 37 does not leak outside.

Figure 4A:
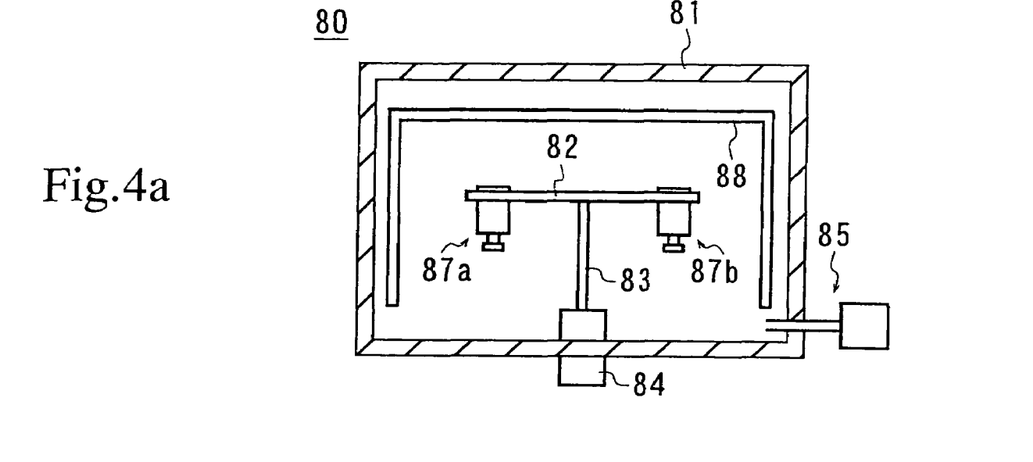

Next, a process for degassing the adhesive material 37 in the adhesive container 30 is described. Numeral 80 in FIG. 4 (a) shows centrifugal degassing apparatus. The centrifugal degassing apparatus 80 is provided with a vacuum chamber 81, a motor 84, a rotation axis 83, an arm 82 and a vacuum pumping system 85.

Symbols 87a, 87b in FIG. 4 (a) show a plurality of objects to be subjected to a degas operation (objects to be degassed, hereinafter) respectively. Objects to be degassed, 87a and 87b comprise the adhesive container 30, the adhesive 37 filled in the adhesive container 30 and the plug 50 to prevent the leakage of the adhesive 37 respectively. In addition, the aperture 33 of the adhesive container 30 of the objects to be degassed, 87a and 87b may be covered with a lid member to prevent the intrusion of dust.

In order to dispose the objects to be degassed, 87a and 87b in the vacuum chamber 81, a lid or door of the vacuum chamber 81 is first opened and the objects to be degassed, 87a and 87b are hung at the arm 82. As for the objects to be degassed, 87a and 87b hung at the arm 82, the plug 50 orients perpendicularly downward and the aperture 33 of the container body 31 orients upward.

When the interior of the vacuum chamber 81 is evacuated by the vacuum pumping system 85 after closing the vacuum chamber 81 to prevent the intrusion of the atmosphere, the internal pressure of the vacuum chamber 81 is lowered less than the atmospheric pressure. Namely, the adhesive 37 is placed in a vacuum atmosphere and, therefore, gasses dissolved in the adhesive 37 separate out as bubbles, and micro bubbles inflate.

Figure 4B:
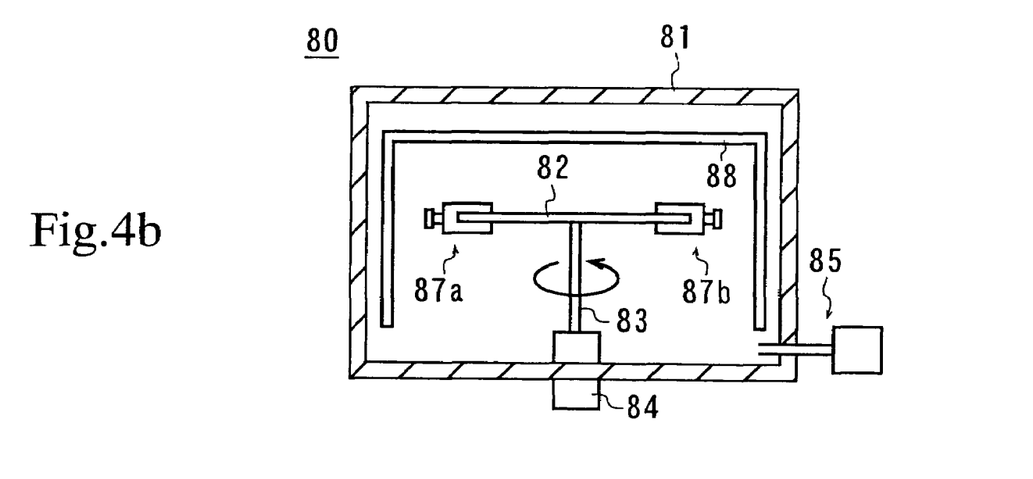

The objects to be degassed, 87a and 87b are so constituted as to be freely swung in a plane running perpendicular at the rotation center of the arm 82, and when a motor 84 is started to allow a rotation axis 83 to rotate around the perpendicular rotation axis while performing evacuation, the arm 82 is rotated in a horizontal plane and a centrifugal force is applied to the objects to be degassed, 87a and 87b.

When a centrifugal force is applied to the objects to be degassed, 87a and 87b, the objects to be degassed, 87a and 87b are on the level with the arm 82 by the centrifugal force and are rotated with the plug 50 oriented toward the outer direction of a rotation and the aperture 33 of the container body 31 oriented toward the central direction of the rotation.

Thus, a centrifugal force bigger than the gravitational force is applied to the adhesive 37 and, as a result, the adhesive 37 is strongly pressed against the bottom 32 of the container body 31 and the plug 50; on the contrary, bubbles in the adhesive 37 are forcibly pushed to the central direction of the rotation. And when the bubbles reach the surface of the adhesive 37, gasses constituting the bubbles are released in a vacuum atmosphere and are discharged to the outside of the vacuum atmosphere by the vacuum pumping system 85.

In addition, in the centrifugal degassing apparatus 80, a heater 88 is disposed in the vicinity of objects to be degassed, 87a and 87b under rotation.

It is such constituted that, by preheating the heater 88 when objects to be degassed, 87a and 87b are rotated, infrared rays are irradiated to objects to be degassed, 87a and 87b under rotation.

Accordingly, the adhesive container 30 constituting the objects to be degassed, 87a and 87b under rotation is heated, therefore the adhesive 37 in the adhesive container 30 is designed to be heated while a centrifugal force generated by the rotation is applied thereto.

Accordingly, since the hardening reaction of the adhesive 37 is proceeded by the heating, gasses dissolved in the adhesive 37 are likely to be generated as bubbles and, further, the generated bubbles are degassed by the centrifugal force and the evacuation.

However, if the hardening reaction of the adhesive 37 during evacuation, heating and centrifugal degassing excessively proceeds, the adhesive 37 can not be discharged in a subsequent process. Accordingly, it is preferable to proceed with the hardening reaction at a reaction rate ranging from 2% or more to 20% or less.

After heating, evacuation and centrifugal degassing are performed for a predetermined time, the motor 84 is stopped, the evacuation of the vacuum chamber 81 by the vacuum pumping system 85 is finished and the objects to be degassed, 87a and 87b are taken out of the centrifugal degassing apparatus 80.

Figure 1C:
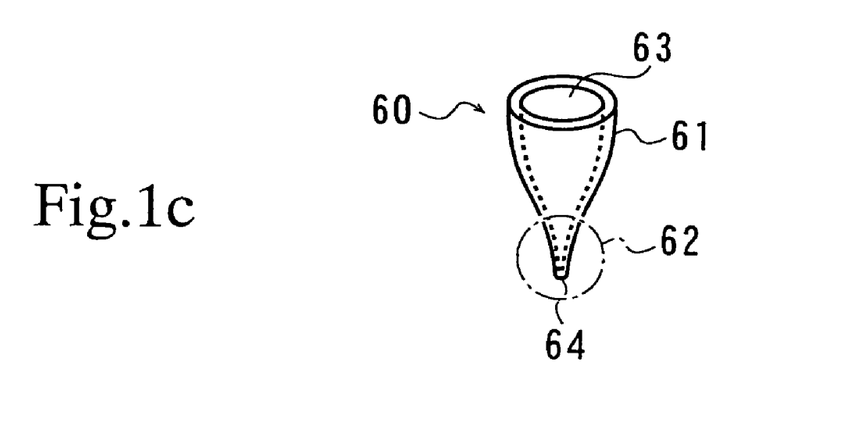

Next, the plug 50 is replaced with a mouthpiece member 60 shown in FIG. 1 (c).

The mouthpiece member 60 is a tapered tube, wherein the size of an aperture 63 of a bigger diameter at the opposite side to the tapered part is almost the same size as the outer diameter of the protrusion 41, and preferably, a screw thread is provided on the internal surface of the aperture 63 to mount the mouthpiece member 60 to the top of the protrusion 41.

Figure 3A:
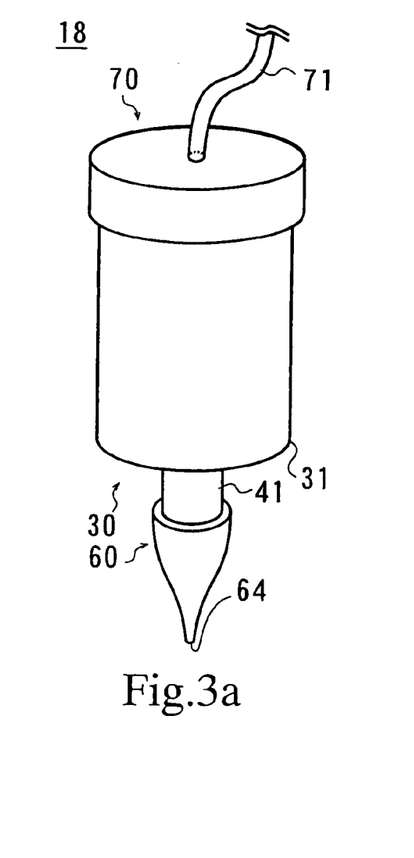
Figure 3B:
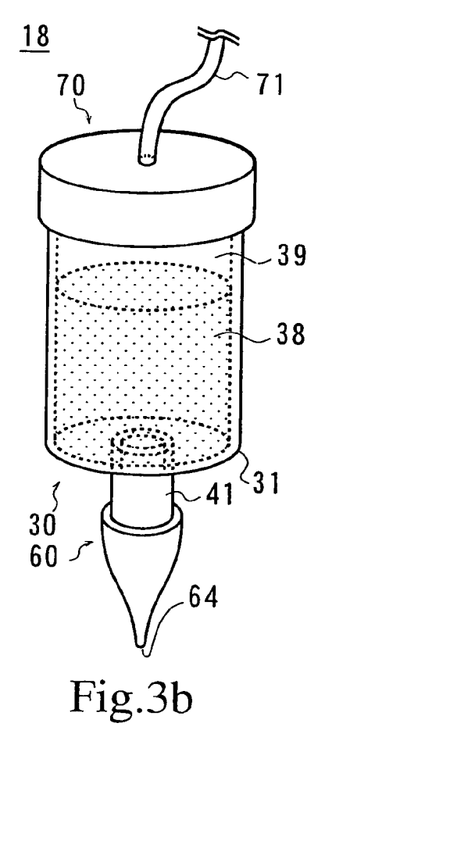

Numeral 18 in FIGS. 3 (a) and (b) shows an adhesion apparatus comprising a semi-hardened adhesive 38, the adhesive container 30 accommodating the adhesive 38, the mouthpiece member 60 mounted to the adhesive container 30, and a lid member 70 covering the aperture 33 of the container body 31.

The adhesive 38 has been subjected to heating, evacuation and centrifugal degassing while being contained in the adhesive container 30 and is semi-hardened.

A pipe 71 is connected to the lid member 70 at one end thereof, and to a gas cylinder not shown in the FIGS. 3 (a) and 3 (b) at the other end.

A clearance 39 is formed between the lid member 70 and the liquid surface of the semi-hardened adhesive 38 and, when a certain amount of gas is sent from the gas cylinder, the gas is designed to be supplied to the clearance 39 through the pipe 71.

A pore 64, which is the discharging outlet of a small diameter, is disposed at the tip of the tapered part 62 of the mouthpiece member 60.

The gas supplied to the clearance 39 presses the liquid surface of the semi-hardened adhesive 38 and the same volume of the adhesive 38 as that of the gas supplied is discharged from the pore 64.

Figure 5A:
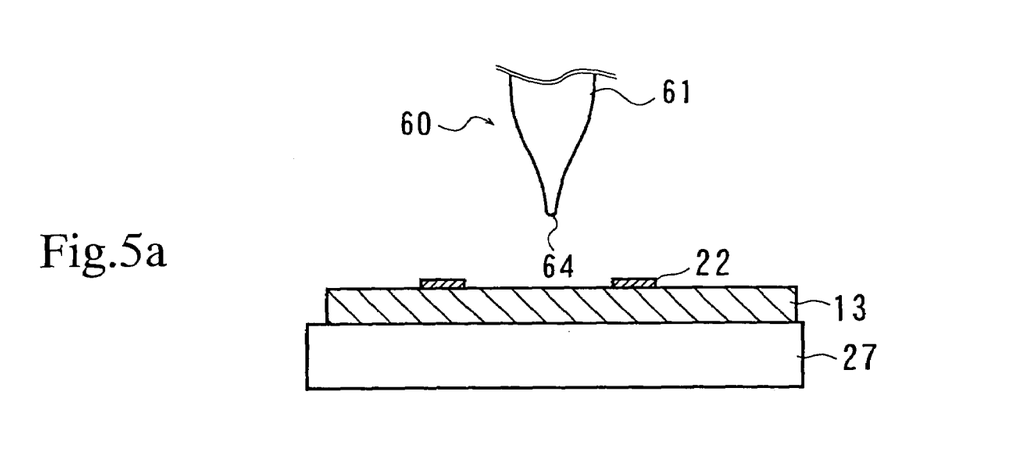

Numeral 27 in FIG. 5 (a) is a working table for coating, on which a base film 13 composed of a resin is disposed. A wiring film composed of a patterned copper foil is extended on the surface of the base film 13. Numeral 22 in FIG. 5 (a) is a part of the wiring film, which serves as a connecting part to which a chip is electrically connected as described later.

Above the connecting part 22, the adhesive container 30 in the state shown in FIGS. 3 (a), (b) is disposed, whose pore 64 of the mouthpiece member 60 is oriented to the surface of the base film 13.

Next, a certain amount of gas is supplied to the container body 31 and a certain amount of the semi-hardened adhesive 38 is then discharged from the pore 64.

Figure 5B:
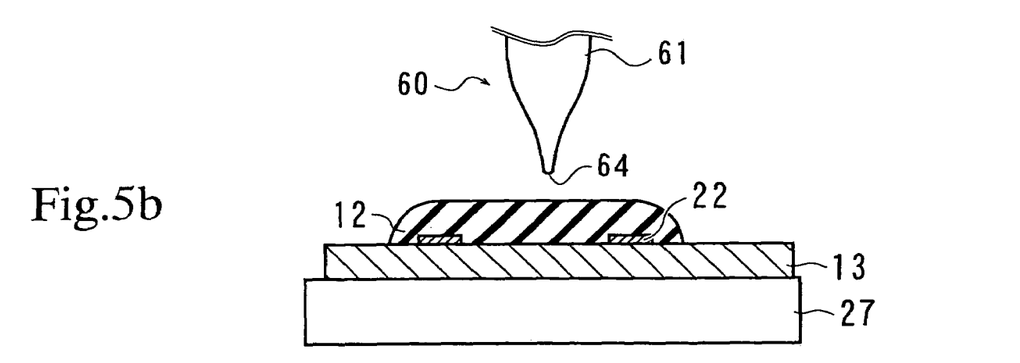

Numerical 12 in FIG. 5 (b) shows a semi-hardened adhesive discharged. The connecting part 22 is extended on the base film 13, and the surface of the base film 13 and that of the connecting part 22 are partially covered with the adhesive 12 discharged.

Figure 6A:
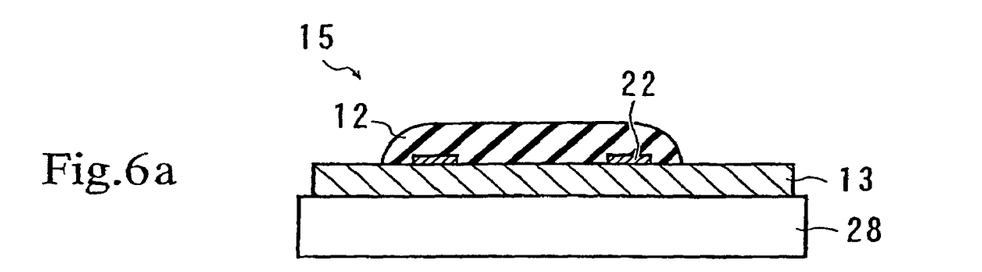

Numeral 15 in FIG. 6 (a) shows a substrate where a certain amount of the adhesive 12 is coated on the base film 13.

The substrate 15 is moved from the working table for coating 27 to a working table for mounting 28 disposed near the working table for coating 27.

Figure 6B:
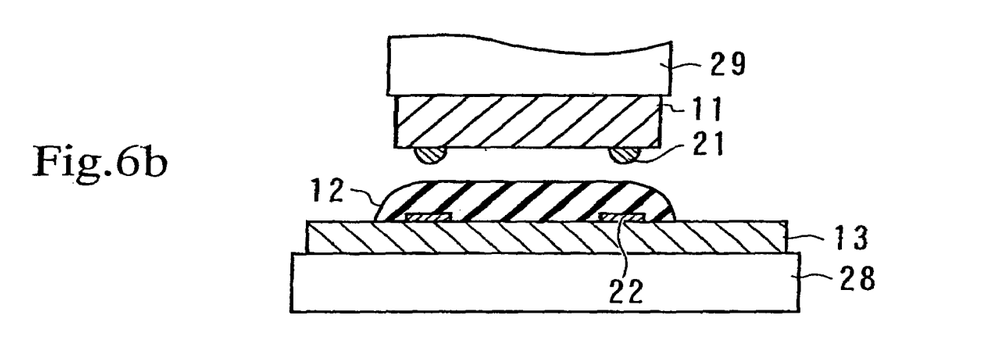
Figure 6C:
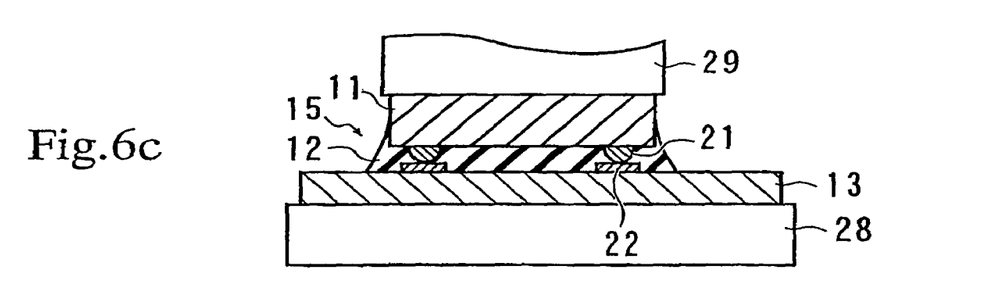

Next (as shown in FIGS. 6a–6c), a chip 11 retained by a pressing jig 29 is rested above the connecting part 22 of the substrate 15, positioning is performed between the connecting part 21 of the chip 11 and the connecting part 22 of the substrate 15, the pressing jig 29 is moved downward, and the chip 11 is dabbed at the surface of the adhesive 12. When the chip 11 is pressed by the pressing jig 29, the chip 11 pushes the adhesive 12 away to allow the connecting parts 21, 22 to contact with each other. Although an integrated circuit or individual semiconductor chip constituted of a silicon crystal, GaAs crystal or the like is normally used for the chip 11, a silicon chip for a conduction test is used here.

A heater is disposed inside the pressing jig 29 to preheat the chip 11 at a temperature at which the hardening reaction of the adhesive 12 is progressed and, consequently, the adhesive 12 is heated by the chip 11.

The working table for coating 28 is heated at a predetermined temperature so that it does not cool the adhesive 12.

The reaction of resin components in the adhesive 12 proceeds through heat supplied from the chip 11 and, when connecting parts 21, 22 as contacted with each other are hardened up to 100% or near 100%, the chip 11 is mounted on the substrate 15 by the hardened adhesive 12.

In this case, since the hardening reaction has proceeded in the adhesive 12 before temperature up by the chip 11 to make the same be semi-hardened, a time period until the complete hardening of the adhesive 12 can be shortened by an extent corresponding to the hardening reaction beforehand.

After the complete hardening of the adhesive 12 to allow the chip 11 to be mounted on the base film 13, the pressing jig 29 is removed from the chip 11, the substrate 15 mounted with the chip 11 is moved to a subsequent process and the substrate 15 just after coated with the adhesive 12 is moved from the working table for coating 27 to the working table for mounting 28 and mounting of the chip 11 is continued.

As mentioned above, according to the invention the adhesive 12 is not heated on the working table for coating 27, therefore even if a trouble occurs in the mounting process of the chip 11 or other processes and the substrate 15 is left as it stands on the working table for coating 27, no defect occurs in the substrate since the hardening reaction of the adhesive 12 does not proceed.

EXAMPLES

Adhesives 38 of Examples 1 to 8 and Comparative Examples 1 to 8 were prepared by changing kinds of resins and heating conditions during vacuum degassing, the chip 11 was affixed with the adhesive 12 discharged on the base film 13, and then mounting conditions were evaluated. In the following Table 1, kinds of resins, heating conditions and results of evaluation are indicated.

(1) Resin

The components of "Resin 1" in Table 1 are HP4032: EP828:HX3748:A187:RY200=40:20:40:3:5.

The components of "Resin 2" are HP4032:EP630: HX3921:A187:RY200=30:30: 40:3:5.

HP4032: Epoxy resin made by Dainippon Ink And Chemicals, Incorporated.

EP828, EP630: Epoxy resins made by Japan Epoxy Resins Co., Ltd.

HX3748, HX3921: Curing agents made by Asahi Kasei Corporation

A187: Coupling agent made by Nihonunica Corporation

PY200: Filler made by Nippon Aerosil Co., Ltd.

All of the above are commercially available under the names given from the companies disclosed.

(2) Conditions of Evacuation, Heating and Centrifugal Degassing

Pressure in the vacuum chamber 81: 5 mTorr or less

Distance between rotation center and the adhesive 37 under degassing: about 30 cm Rotational speed: 1,000 to 1,800 rpm Temperature of the adhesive 37 under rotation: Heating condition A in Table 1

Heating time: Heating condition B in Table 1

TABLE 1

| | Heating condition | | Evaluation results | | | | | |
| --- | --- | --- | --- | --- | --- | --- | --- | --- |
| | A | B | C | D | E | F | G | Remarks |
| Resin 1 | | | | | | | | |
| Comparative Example 1 | Room temperature | 600 | 0 | ○ | X | ○ | X | Generation of voids |
| Example 1 | 60 | 180 | 1.9 | ○ | ○ | ○ | ○ | |
| Example 2 | 60 | 1800 | 21.5 | ○ | ○ | ○ | ○ | |
| Comparative Example 2 | 60 | 2100 | 23.5 | X | — | — | — | Dispensing unable |
| Example 3 | 40 | 600 | 1.9 | ○ | ○ | ○ | ○ | |
| Example 4 | 100 | 120 | 15 | ○ | ○ | ○ | ○ | |
| Comparative Example 3 | 100 | 50 | 5.2 | ○ | X | ○ | X | Insufficient degassing, generation of voids |
| Comparative Example 4 | 110 | 50 | 20.2 | ○ | X | ○ | X | Insufficient degassing, generation of voids |
| Resin 2 | | | | | | | | |
| Comparative Example 5 | Room temperature | 600 | 0 | ○ | X | ○ | X | Generation of voids |
| Example 5 | 60 | 100 | 2.2 | ○ | ○ | ○ | ○ | |
| Example 6 | 60 | 900 | 20.4 | ○ | ○ | ○ | ○ | |
| Comparative Example 6 | 60 | 1200 | 24.5 | X | — | — | — | Dispensing unable |
| Example 7 | 40 | 300 | 2.1 | ○ | ○ | ○ | ○ | |
| Example 8 | 100 | 60 | 16.2 | ○ | ○ | ○ | ○ | |
| Comparative Example 7 | 100 | 50 | 7.3 | ○ | X | ○ | X | Insufficient degassing, generation of voids |
| Comparative Example 8 | 110 | 45 | 19.6 | ○ | X | ○ | X | Insufficient degassing, generation of voids |

(Note)
For Comparative Examples 1 and 5, a vacuum centrifugal degassing was performed at a room temperature (25 ± 2° C.) for 900 seconds.
A: Heating temperature (° C.)
B: Heating time (second)
C: Measurement result of reaction rate (%)
D: Evaluation result of dispensability
E: Evaluation result of appearance
F: Evaluation result of initial conductivity
G: Evaluation result of conductivity after aging (3) Substrate 15
  Base film 13: Polyimide film of 20 μm thick.
  Wiring film: Copper foil of 12 μm thick.
  Connecting part 22: Ni/Au plated layer is formed on the wiring film.

(4) Chip 11
  Dimensions: 6.3×6.3×0.4 mm
  Connecting part 21: Copper bump of diameter 60 μm and height 20 μm and Au plated layer is formed on the surface.

(5) Mounting Conditions
  Temperature of the pressing jig 29 and pressing period: 200° C./10 seconds for Resin 1 and 230° C./5 seconds for Resin 2.
  Temperature of the working table for mounting 28: 80° C.
  Pressing pressure: 60 g/bump (6) Content of Evaluation 1) C: Measurement Results of Reaction Rate (%)
  The reaction rate R is found by the following formula from the calorific value $Q_1$ of DSC (differential scanning calorimetry) before evacuation, heating and centrifugal degassing are performed and the calorific value $Q_2$ of DSC after evacuation, heating and centrifugal degassing were performed.

$$R = \{(1-Q_2)/Q_1\} \times 100$$

2) D: Evaluation Results of Dispensability
  An adhesive that could be discharged was determined ○ and an adhesive that could not be discharged was determined X when the adhesive container 30 of 10 cm³ and the pore 64 of diameter 1 mm were used.

3) E: Evaluation Results of Appearance
  An adhesive without no void (no bubble) was determined ○ and an adhesive with void (bubble) was determined X when the adhesive 12 discharged on the base film 13 was visually observed before mounting the chip 11.

4) F: Evaluation Results of Initial Conductivity
  Resistance value was measured between the connecting parts 21 and 22 with the four-terminal method. An adhesive with the maximum resistance value of 100 mΩ or less was determined ○ and an adhesive with the maximum resistance value exceeding 100 mΩ was determined X.

5) G: Evaluation Results of Conductivity After Aging
  An adhesive mounted with the chip 11 was left in an atmosphere at 85° C. and 85% RH for 1,000 hours, and then the same evaluation as the initial conductivity evaluation was conducted.

(7) Conclusion
  The chip mounting methods according to the present invention (Examples 1 to 8) did not generate voids.
  The evaluation results of Comparative Examples 1 to 8 show that the dispensability was poor when a reaction rate was too high and voids were generated when the same was too low.
  The conditions of heating, evacuation and centrifugal degassing are preferable when the heating temperature is 40° C. or more and 100° C. or less and the reaction rate is 2% or more and 20% or less, judging from the differences in the heating conditions and the reaction rates of Examples 1 to 8 and Comparative Examples 1 to 8. It is desirable that the time is 60 seconds or longer.

OTHER EXAMPLES

As examples other than Examples and Comparative Examples described in Table 1, Resin 1 and Resin 2 filled in the adhesive container 30 respectively were subjected to processing of evacuation and centrifugal degassing at room temperature for 900 seconds, then were left in a vacuum oven controlled at 60° C. for 600 seconds, and were heated and degassed in a vacuum atmosphere. The reaction rates of Resin 1 and Resin 2 were 10.2% and 15.6%, respectively. These adhesives showed preferable results in all of the evaluation items D to G.

OTHER COMPARATIVE EXAMPLES

As Comparative Examples, each of Resin 1 and Resin 2 was left in a vacuum oven controlled at 60° C. for 600 seconds to be heated and degassed in a vacuum atmosphere. After terminating the heating and degassing, each of them was taken out of the vacuum oven and tried to be filled in the adhesive container 30. However, both could not be filled in the container because of increased viscosity, resulting from too much proceeding of the reaction.

Advantageously, embodiments of the present invention provide adhesion free from bubbles.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of adhesion comprising:
  degassing and semi-hardening an adhesive capable of proceeding with reaction and hardening by heating, said adhesive being disposed in an adhesive container having a pore and said adhesive container being heated while degassing by applying a centrifugal force to said adhesive under vacuum atmosphere;
  discharging a desired amount of said semi-hardened adhesive on a substrate from said pore; and
  mounting an object to be affixed to said substrate by bringing said object to be affixed into contact with said adhesive disposed on said substrate, pressing said object to be affixed against said substrate, and hardening said adhesive existing between said substrate and said object to be affixed with heat.

2. The method of adhesion according to claim 1, wherein said object to be affixed is heated in said mounting step.

3. The method of adhesion according to claim 1, wherein said adhesive is hardened at a reaction rate ranging from 2% or more to 20% or less in said semi-hardening step.

4. The method of adhesion according to claim 1, wherein a flexible resin film is used as said substrate and a semiconductor chip is used as said object to be affixed.

5. The method of adhesion according to claim 4, wherein said chip is fixed to said resin film in the state that a connecting part composed of a wiring film on said resin film and a connecting part provided on said chip are brought into contact with each other to connect electrically said wiring film and said chip.

6. The method of adhesion according to claim 1, further comprising supplying a gas to said adhesive container.

7. The method of adhesion according to claim 1, wherein said adhesive is an epoxy resin and heating temperature is 40° C. or more and 100° C. or less in said semi-hardening step.

8. The method of adhesion according to claim 1, wherein said centrifugal force is greater than gravitational force.

* * * * *